(12) United States Patent
Kim et al.

(10) Patent No.: US 8,680,559 B2
(45) Date of Patent: Mar. 25, 2014

(54) LIGHT EMITTING DIODE HAVING ELECTRODE EXTENSIONS FOR CURRENT SPREADING

(75) Inventors: Kyoung Wan Kim, Ansan-si (KR); Soo Young Moon, Ansan-si (KR); Kyu Ho Lee, Ansan-si (KR); Yeo Jin Yoon, Ansan-si (KR); Jeong Hee Yang, Ansan-si (KR); Won Cheol Seo, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 308 days.

(21) Appl. No.: 12/941,536

(22) Filed: Nov. 8, 2010

(65) Prior Publication Data
US 2011/0114990 A1 May 19, 2011

(30) Foreign Application Priority Data
Nov. 16, 2009 (KR) .................. 10-2009-0110097

(51) Int. Cl.
*H01L 33/00* (2010.01)
(52) U.S. Cl.
USPC .................. 257/99; 257/98; 257/E33.062
(58) Field of Classification Search
USPC .................. 257/99, 79, 676, 81, 88, 103, 91
See application file for complete search history.

(56) References Cited

U.S. PATENT DOCUMENTS

| | | | |
|---|---|---|---|
| 6,650,018 B1 | 11/2003 | Zhao et al. | |
| 7,087,985 B2 * | 8/2006 | Park et al. | 257/676 |
| 7,429,755 B2 * | 9/2008 | Hsu | 257/81 |
| 7,935,979 B2 * | 5/2011 | Shum et al. | 257/99 |
| 8,148,736 B2 * | 4/2012 | Yahata et al. | 257/81 |

(Continued)

FOREIGN PATENT DOCUMENTS

WO 2008/155452 12/2008

OTHER PUBLICATIONS

Non-Final Office Action of U.S. Appl. No. 12/962,365 was mailed Oct. 5, 2012.

(Continued)

*Primary Examiner* — Bilkis Jahan
(74) *Attorney, Agent, or Firm* — H.C. Park & Associates, PLC

(57) ABSTRACT

An exemplary embodiment of the present invention discloses a light emitting diode including a substrate having a first edge and a second edge opposite to each other, a light emitting structure disposed on the substrate, the light emitting structure including a first semiconductor layer and a second semiconductor layer, a plurality of first electrode pads arranged on an upper surface of the first semiconductor layer, the first electrode pads arranged in a vicinity of the first edge, a plurality of second electrode pads arranged on the second semiconductor layer, the second electrode pads arranged in a vicinity of the second edge, a plurality of first extensions, each first extension extending from a first electrode pad, and a plurality of second extensions, each second extension extending from a second electrode pad. The first extensions include intrusion parts extending in a direction from the first edge to the second edge, wherein the intrusion parts are spaced apart from each other and not connecting with the second electrode pads. Further, the second extensions include intrusion parts extending in a direction from the second edge to the first edge, wherein the first extension intrusion parts each extend into a region between two of the second extension intrusion parts.

16 Claims, 3 Drawing Sheets

(56) References Cited

U.S. PATENT DOCUMENTS

| | | | |
|---|---|---|---|
| 8,198,648 B2* | 6/2012 | Bougrov et al. | 257/98 |
| 8,237,180 B2* | 8/2012 | Iizuka et al. | 257/95 |
| 8,258,519 B2* | 9/2012 | Hsu | 257/79 |
| 2004/0140473 A1* | 7/2004 | Chen | 257/79 |
| 2006/0192223 A1* | 8/2006 | Lee et al. | 257/99 |
| 2008/0142821 A1 | 6/2008 | Sakamoto et al. | |
| 2008/0210972 A1 | 9/2008 | Ko et al. | |
| 2008/0296603 A1* | 12/2008 | Chu | 257/99 |
| 2010/0163910 A1* | 7/2010 | Bougrov et al. | 257/98 |
| 2011/0089442 A1 | 4/2011 | Jing et al. | |
| 2012/0037946 A1 | 2/2012 | Yu et al. | |

OTHER PUBLICATIONS

Notice of Allowance of U.S. Appl. No. 12/962,365 was mailed Feb. 8, 2013.

* cited by examiner

LIGHT EMITTING DIODE HAVING ELECTRODE EXTENSIONS FOR CURRENT SPREADING

CROSS-REFERENCE TO RELATED APPLICATION

This application claims priority from and the benefit of Korean Patent Application No. 10-2009-0110097, filed on Nov. 16, 2009, which is hereby incorporated by reference for all purposes as if fully set forth herein.

BACKGROUND OF THE INVENTION

1. Field of the Invention

The present invention relates to a light emitting diode, and more particularly, to a light emitting diode having electrode extensions for current spreading.

2. Discussion of the Background

Gallium nitride (GaN)-based light emitting diodes (LEDs) have been used for is various applications, such as a natural color LED display, an LED traffic signal, a white LED, or the like. Also, a high-efficiency white LED is expected to replace a fluorescent lamp. In particular, the efficiency of the white LED reaches a similar level to the efficiency of the general fluorescent lamp.

The GaN-based light emitting diode is generally formed by growing epitaxial layers on a sapphire substrate, for example, and includes an N-type semiconductor layer, a P-type semiconductor layer, and an active layer interposed therebetween. Meanwhile, an N-electrode is formed on the N-type semiconductor layer and a P-electrode is formed on the P-type semiconductor layer. The electrodes of the light emitting diode are electrically connected to an external power supply, which drives the light emitting diode. Current flows into the N-electrode from the P-electrode via the semiconductor layers.

Generally, the P-type semiconductor layer has a high resistivity, and thus current may be unevenly spread in the P-type semiconductor layer and concentrated at a portion where the P-electrodes are formed, and current may also intensively flow through the edges of the diode. The current concentration leads to the reduction of a light emitting region, thereby degrading luminous efficiency. In order to improve current spreading, a transparent electrode layer having a low resistivity may be formed on the P-type semiconductor layer. Current that flows through the P-electrode is spread in the transparent electrode layer and then flows into the P-type semiconductor layer, thereby making it possible to expand the light emitting region of the light emitting diode.

However, since the transparent electrode layer absorbs light, the thickness thereof is limited. As a result, the transparent electrode layer has a limited current spreading ability. In particular, a large-area light emitting diode having a light-emitting region of about 1 mm² or more, which is used for high output, has a limit to current spreading using the transparent electrode layer.

Meanwhile, the current flows through the semiconductor layers and then flows out to the N-electrode. Therefore, the current is concentrated on a portion of the N-type semiconductor layer, on which the N-electrode is formed, so that the current flowing in the semiconductor layer may be concentrated around a region where the N-electrode is formed.

FIG. 1 shows a light emitting diode having electrode extensions for current spreading according to the related art.

Referring to FIG. 1, the light emitting diode has a general rectangular shape, wherein n-electrode pads 21 and p-electrode pads 31 are disposed at edge portions to be opposite each other. Extensions 23 are formed along the edges of the light emitting diode from the n-electrode pads 21 and intrusion parts 25a and 25b extend inwardly from the extensions 23 of the edges. The intrusion parts 25a and 25b intrude into the light emitting diode in parallel with an imaginary diagonal line extending from one of the four corners of the light emitting diode.

Meanwhile, intrusion parts 35a each extend in a diagonal direction from the p-electrode pads 31, and sub-intrusion parts 35b extend by being branched from the intrusion parts 35a.

A transparent electrode layer 39 is disposed on the upper surface of the light emitting diode. The intrusion parts 35a and the sub-intrusion parts 35b are disposed on the transparent electrode layer 39 to assist in current spreading.

Although not shown in FIG. 1, the light emitting diode includes an n-type lower semiconductor layer, a p-type upper semiconductor layer, and an active layer, in which the transparent electrode layer 39 is disposed on the p-type upper semiconductor layer. In addition, the n-electrode pads 21, the extensions 23, and the intrusion parts 25a and 25b are disposed on the n-type lower semiconductor layer and the p-type electrode pads 31 are disposed on the p-type upper semiconductor layer or the transparent electrode layer 39.

The related art adopts the extensions 23 and the intrusion parts 25a and 25b to assist in current spreading on the n-type lower semiconductor layer and also disposes the intrusion parts 35a and the sub-intrusion parts 35b to assist in current spreading on the transparent electrode layer 39.

However, the related art removes a relatively wide area of the active layer and the upper semiconductor layer in order to form the extensions 23. Therefore, the light emitting area is considerably reduced and the light output is reduced accordingly. In addition, the intrusion parts 25a and 25b and the intrusion parts 35a and 35b are disposed in a rotational symmetry type based at the center of the light emitting diode in order to evenly emit light over the entire region of the light emitting diode. However, light may not be evenly emitted over the entire region of the light emitting diode, and in particular, light may be unevenly emitted at the central region of the light emitting diode.

SUMMARY OF THE INVENTION

Exemplary embodiments of the present invention provide a light emitting diode capable of evenly spreading current while mitigating a reduction in a light emitting area.

Exemplary embodiments of the present invention also provide a light emitting diode capable of reducing forward voltage while improving light output according to improved current spreading capability.

Additional features of the invention will be set forth in the description which follows, and in part will be apparent from the description, or may be learned by practice of the invention.

An exemplary embodiment of the present invention discloses a light emitting diode including a substrate having a first edge and a second edge opposite to each other, a light emitting structure disposed on the substrate, the light emitting structure including a first semiconductor layer and a second semiconductor layer, a plurality of first electrode pads arranged on an upper surface of the first semiconductor layer, the first electrode pads arranged in a vicinity of the first edge, a plurality of second electrode pads arranged on the second semiconductor layer, the second electrode pads arranged in a vicinity of the second edge, a plurality of first extensions, each first extension extending from a first electrode pad, and a plurality of second extensions, each second extension extending from a second electrode pad. The first extensions include intrusion parts extending in a direction from the first edge to the second edge, wherein the intrusion parts are spaced apart from each other and not connecting with the second electrode pads. Further, the second extensions include intrusion parts extending in a direction from the second edge to the first edge, wherein the first extension intrusion parts each extend into a region between two of the second extension intrusion parts.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
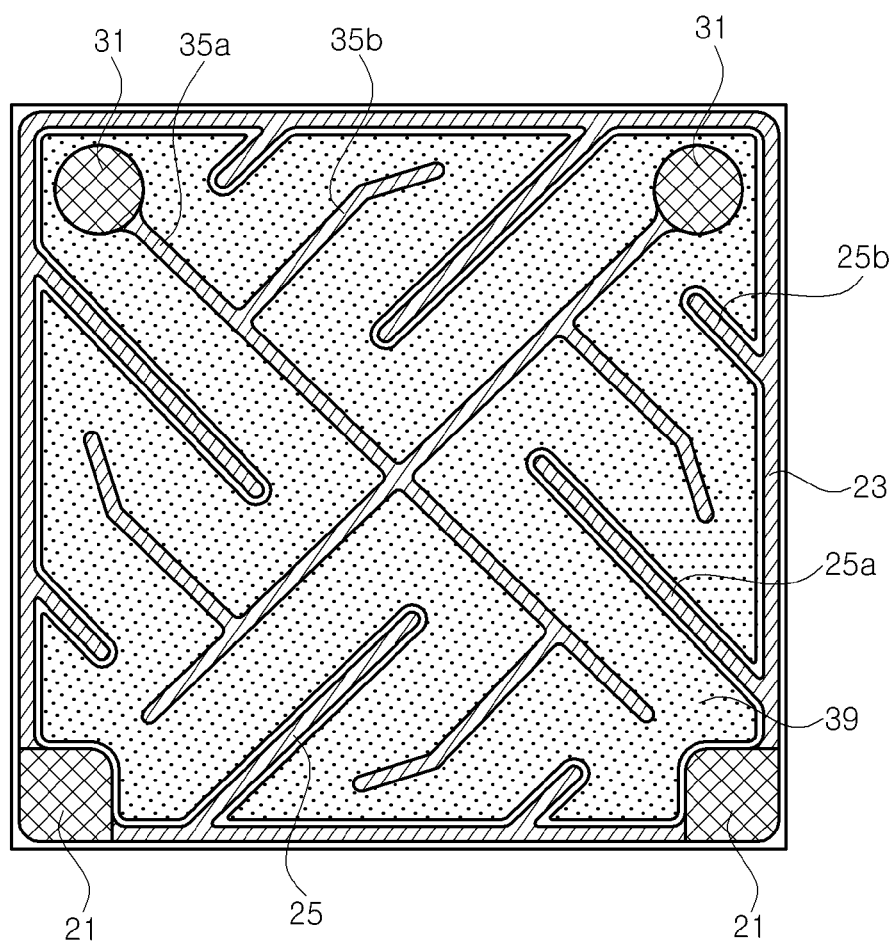
FIG. 1 is a plan view showing a light emitting diode according to the related art.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element such as a layer, film, region or substrate is referred to as being "on" another element, it can be directly on the other element or intervening elements may also be present. In contrast, when an element is referred to as being "directly on" another element, there are no intervening elements present.

Figure 2:
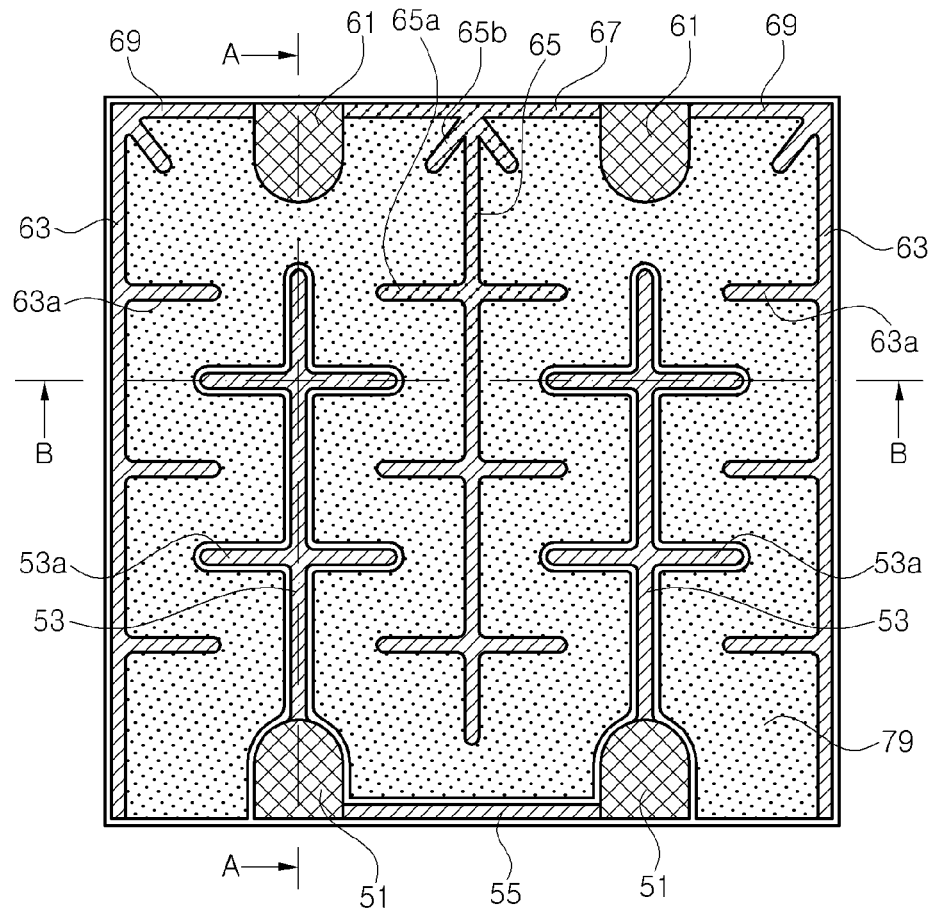
FIG. 2 is a plan view showing a light emitting diode according to an exemplary embodiment of the present invention.
Figure 3:
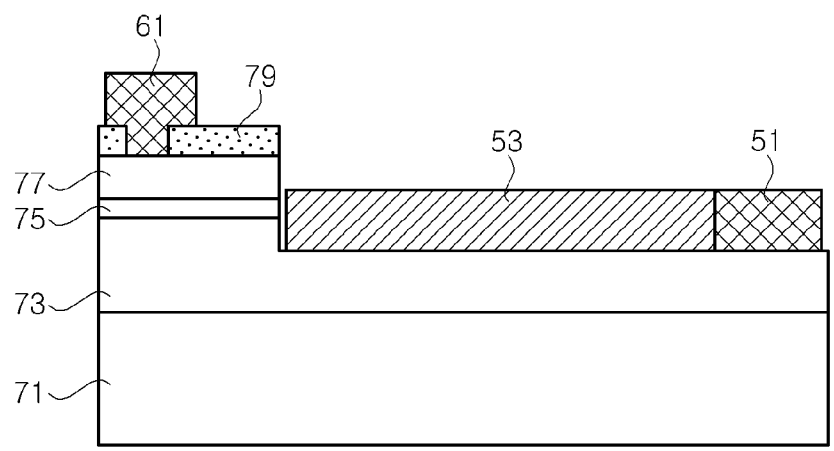
FIG. 3 is a cross-sectional view taken along the line A-A of FIG. 2.
Figure 4:
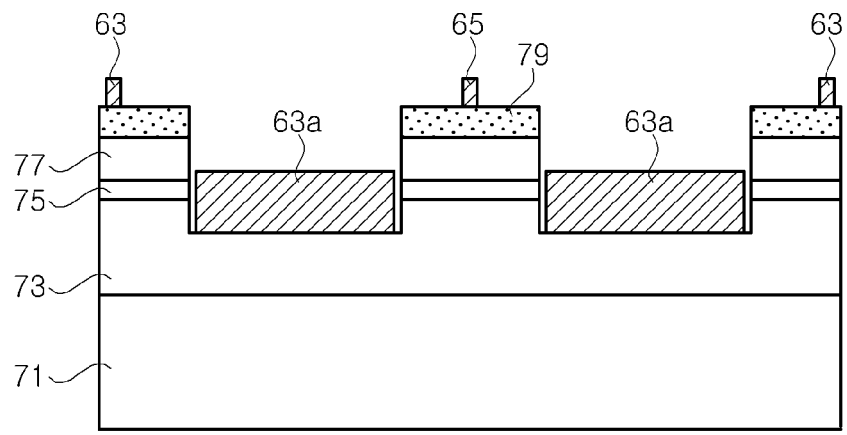
FIG. 4 is a cross-sectional view taken along the line B-B of FIG. 2.

FIG. 2 is a plan view showing a light emitting diode according to an exemplary embodiment of the present invention, FIG. 3 is a cross-sectional view taken along the line A-A of FIG. 2, and FIG. 4 is a cross-sectional view taken along the line B-B of FIG. 2.

Referring to FIG. 2, FIG. 3, and FIG. 4, the light emitting diode includes a substrate 71, a lower semiconductor layer 73, an active layer 75, an upper semiconductor layer 77, a transparent electrode layer 79, a plurality of first electrode pads 51, a plurality of second electrode pads 61, first extensions 53 and 55, and second extensions 63, 65, 67, and 69. Further, the light emitting diode may include sub-intrusion parts 53a, 63a, 65a, and serifs 65b.

The material comprising the substrate 71 is not specifically limited and may be a sapphire substrate. The substrate 71 may have edges opposite to each other, and which are parallel with each other. The substrate 71 may have a rectangular or quadrangular shape, but is not necessarily limited thereto.

A light emitting structure is disposed on the substrate 71 and includes a lower semiconductor layer 73, an active layer 75, and an upper semiconductor layer 77. The lower semiconductor layer 73 may be an n-type and the upper semiconductor layer 77 may be a p-type, or vice versa. The active layer 75 is interposed between the lower semiconductor layer 73 and the upper semiconductor layer 77.

The lower semiconductor layer 73, the active layer 75, and the upper semiconductor layer 77 may be made of a gallium nitride-based compound semiconductor material, that is, (Al, In, Ga)N. The constituent elements and composition of the active layer 75 are determined to emit light having a required wavelength, for example, ultraviolet rays or blue light. The lower semiconductor layer 73 and the upper semiconductor layer 77 are made of a material having a larger band gap than that of the active layer 75.

The lower semiconductor layer 73 and/or the upper semiconductor layer 77 may be formed as a single layer structure as shown or a multi-layer structure. In addition, the active layer 75 may be formed to have a single quantum well structure or a multi quantum well structure. In addition, a buffer layer (not shown) may be interposed between the substrate 71 and the lower semiconductor layer 73.

The semiconductor layers 73, 75, and 77 may be grown using a metal-organic chemical vapor deposition (MOCVD) technology or a molecular beam epitaxy (MBE) technology and the regions of the lower semiconductor layer 73 may be patterned to be exposed using a photolithography and etching process.

The transparent electrode layer 79 covers the upper semiconductor layer 77 and may be made of indium tin oxide (ITO) or Ni/Au. The transparent electrode layer 79 has lower resistivity than the upper semiconductor layer 77, such that it serves to spread current.

Meanwhile, the first electrode pads 51 contact the upper surface of the lower semiconductor layer 73 and is disposed near a first edge of the substrate 71. The first electrode pads 51, which are, for example, n-electrode pads, are wire bonding pads for connecting the light emitting diode to an external power supply. The second electrode pads 61 are disposed on the upper semiconductor layer 77 and disposed near a second edge of the substrate 71 opposite to the first edge. The second electrode pads 61, which are, for example, p-electrode pads, may contact the upper semiconductor layer 77, while penetrating through the transparent electrode layer 79 as shown in FIG. 3. The second electrode pads 61 may also be disposed on the transparent electrode layer 79.

The first extensions 53 and 55 extend from the first electrode pads 51 and the second extensions 63, 65, 67, and 69 extend from the second electrode pads 61. In the present exemplary embodiment, the first extensions 53 and 55 include intrusion parts 53 directly extending to the vicinity of the second edge from the first electrode pads 51, sub-intrusion parts 53a extending to both sides from the intrusion parts 53, and a connection part 55 connecting the first electrode pads 51 to each other. The first extensions 53 and 55 may be made of a conductive material, for example, Ti/Al. In this configuration, "the vicinity of the second edge" means that the end thereof is closer to the second edge than the first edge.

The intrusion parts 53 directly extend from the first electrode pads 51 to the vicinity of the second edge and have substantially the same length, width, and thickness. Therefore, the corresponding positions of the intrusion parts 53 have substantially the same potential. In addition, the intrusion parts 53 are terminated before they reach a straight line connecting the second electrode pads 61. The intrusion parts 53 may extend to be spaced apart from each other and may be parallel with each other. For example, when the substrate 71 has a rectangular shape, the intrusion parts 53 may be parallel with edges of the substrate. Meanwhile, the sub-intrusion parts 53*a* extend to both sides thereof from the intrusion parts 53. The sub-intrusion parts 53*a* assist in current spreading over a wide region of the light emitting diode. The connection part 55 connects the first electrode pads 51 to each other, such that the first electrode pads 51 have substantially the same potential and current is also spread in a region between the first electrode pads 51.

Meanwhile, the second extensions 63, 65, 67, and 69 may include the intrusion parts 63 and 65, the connection part 67 connecting the second electrode pads 61 to each other, the connection part 69 connecting the intrusion parts 63 to the second electrode pads 61, and the sub-intrusion parts 63*a* and 65*a* and the serif 65*b* extending from the intrusion parts 63 and 65.

The intrusion parts 63 extend to the vicinity of the first edge from the vicinity of the second edge. In this configuration, the "vicinity of the first edge" means that the end thereof closer to the first edge than the second edge. The intrusion parts 63 are disposed at an outermost side of the light emitting diode and may extend to a position closer to the first edge than the centers of the first electrode pads 51. These intrusion parts 63 are connected to the second electrode pads 61 through the connection part 69 disposed along the second edge. The sub-intrusion parts 63*a* may extend to one side of the intrusion parts 63.

Meanwhile, the intrusion part 65 extends to the vicinity of the first edge from the connection part 67. The intrusion part 65 is terminated before it reaches the connection part 55 connecting the first electrode pads to each other. The intrusion part 65 may extend from the center of the connection part 67 connecting two second electrode pads 61 to each other and the sub-intrusion parts 65*a* may extend to both sides thereof.

The intrusion parts 63 and 65 may be formed to have substantially the same width and thickness and the length of the extensions from the end of the intrusion part 63 to the second electrode pad 61 is substantially the same as the length of the extensions from the end of the intrusion part 65 to the second electrode pad 61. Therefore, the corresponding positions of the intrusion parts 63 and 65 may have substantially the same potential.

Meanwhile, the serifs 65*b* may be formed at a position where the connection part 67 meets the intrusion part 65. The serif 65*b* may be further formed at a position where the intrusion part 63 meets the connection part 69. The serif 65*b* assists in current spreading at a dead zone where it is difficult to spread current.

Each of the intrusion parts 53 extend to a region between the second extensions, specifically, the intrusion parts 63 and the intrusion part 65. In other words, the intrusion parts 53, 63, and 65 are disposed such that the intrusion parts 63 and 65 of the second extension parts enclose the intrusion part 53 of the first extension parts. In addition, the length to the intrusion parts 63 and 65 disposed at both sides thereof from one point of the intrusion points 53 may be substantially the same. In addition, the sub-intrusion parts 53*a* and the sub-intrusion parts 63*a* and 65*a* may be formed parallel with the first edge and the second edge and the sub-intrusion parts 53*a* may extend to the region between the sub-intrusion parts 63*a* or 65*a*.

Figure 5:
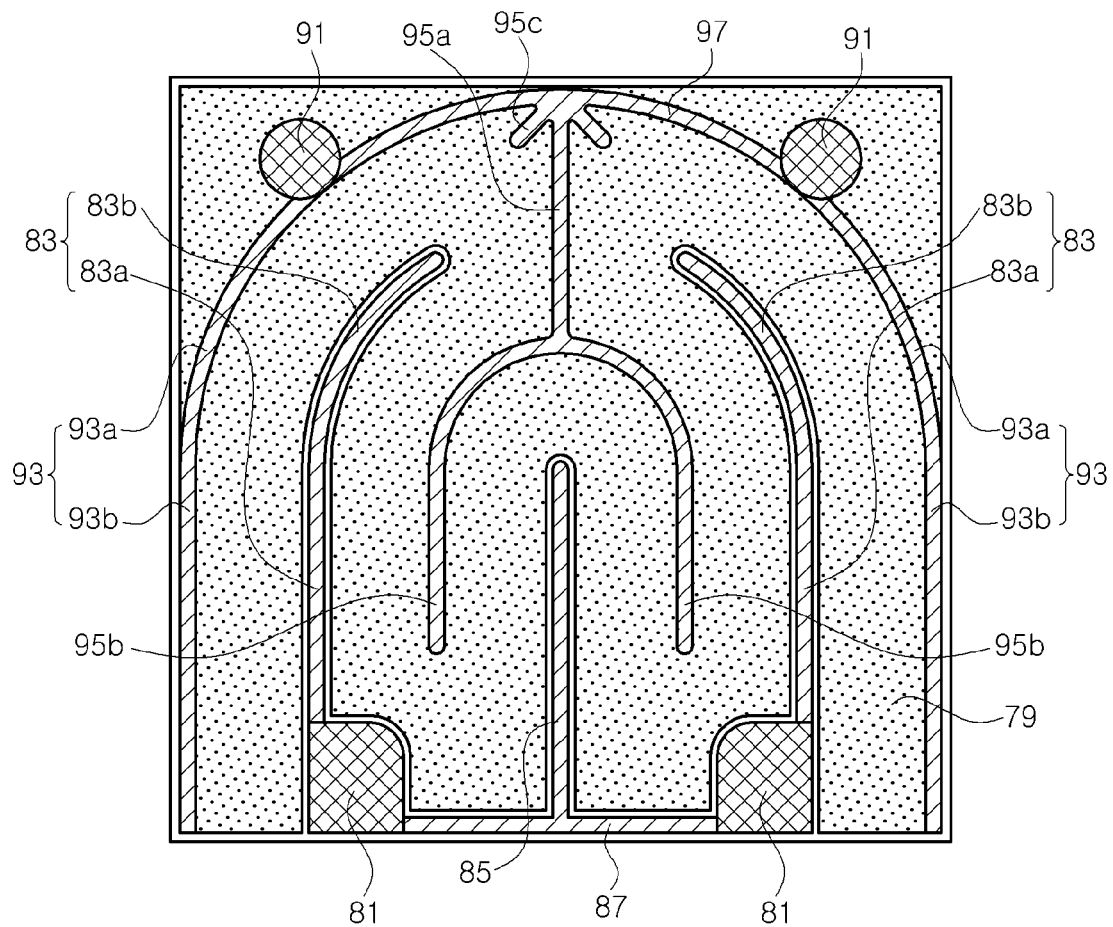
FIG. 5 is a plan view showing a light emitting diode according to an exemplary embodiment of the present invention.

FIG. 5 is a plan view showing a light emitting diode according to an exemplary embodiment of the present invention. The light emitting diode according to the exemplary embodiment is substantially the same as the light emitting diode described with reference to FIG. 2, FIG. 3, and FIG. 4 except for the second electrode pads, the first extensions, and the second extensions, and therefore a description of these same components will be omitted.

Referring to FIG. 5, the first electrode pads 81 contact the upper surface of the lower semiconductor layer 73 and are disposed near the first edge of the substrate 71, as described with reference to FIG. 2. Meanwhile, the second electrode pads 91 are disposed on the upper semiconductor layer 77 and disposed near the second edge of the substrate 71 opposite to the first edge. The second electrode pads 91 may contact the upper semiconductor layer 77, penetrating through the transparent electrode layer 79 as described with reference to FIG. 3. The second electrode pads 91 may also be disposed on the transparent electrode layer 79.

The first extensions 83, 85, and 87 extend from the first electrode pads 81 and the second extensions 93, 95, and 97 extend from the second electrode pads 91. In the present exemplary embodiment, the first extensions include the intrusion parts 83 and 85 and the connection part 87. The first extensions 83, 85, and 87 may be made of a conductive material, for example, Ti/Al.

The intrusion parts 83 directly extend from the first electrode pads 81 to the vicinity of the second edge and have substantially the same length, width, and thickness. Therefore, the corresponding positions of the intrusion parts 83 have substantially the same potential. In addition, the intrusion parts 83 are terminated before they reach the second electrode pads 91. Meanwhile, the connection part 87 may connect the first electrode pads 81 to each other, and the intrusion part 85 extend from the connection part 87 to the vicinity of the second edge. The connection part 87 may connect the first electrode pads 81 to each other in a straight line shape along the first edge and the intrusion part 85 may extend perpendicularly from the connection part 87.

Meanwhile, each of the intrusion parts 83 may have a straight part 83*a* extending substantially parallel with the intrusion part 85 from the first electrode pads 81 and a curved part 83*b* bent in a curved shape from the end of the straight part 83*a*. The straight parts 83*a* and the intrusion part 85 may be parallel with edges of both sides of the substrate, when the substrate 71 has, for example, a rectangular shape. The curved parts 83*b* will be described below. The intrusion parts 83 and the intrusion part 85 extend to be spaced apart from each other.

Meanwhile, the second extensions may include intrusion parts 93 and 95, a connection part 97, an intrusion part 95, and a serif 95*c*. The intrusion parts 93 extend to the vicinity of the first edge from the vicinity of the second edge. The intrusion parts 93 may include the curved part 93*a* bent in a curve shape from the first electrode pads 91 and a straight part 93*b* extending in a straight line from the curved part 93*a*. The curved part 93*a* is bent in a similar shape as the curved part 83*b*, such that the distance between the curved part 93*a* and the curved part 83*b* is maintained to be substantially the same. Meanwhile, the straight part 95*b* is parallel with the straight part 83*a*. The intrusion parts 93 are disposed at the outermost side of the light emitting diode and may extend to a position closer to the first edge than the centers of the first electrode pads 81.

Meanwhile, the connection part 97 connects the second connection parts 91 to each other and may have a curve as shown. The connection part 97 may be an extension line of the curved part 93a, such that both the curved parts 93a and the connection part 97 together may have a shape similar to that of a dome, as shown.

Meanwhile, the intrusion part 95 extends to the vicinity of the first edge from the connection part 97. The intrusion part 95 extends from the connection part 97 in one line 95a and then, branches into two lines 95b. The two lines 95b extend in a curve and then extend in a straight line. The two lines 95b have substantially the same length and are terminated before they reach the connection part 87. Therefore, the intrusion part 95 has a shape similar to that of a wine cup, and the intrusion part 85 extends to the region between the two lines 95b.

The curved parts 83b of the intrusion parts 83 are bent along the curve of the two lines 95b and the connection part 97, and the curved parts 93a of the intrusion parts 93 are bent along the curve of the curved parts 83b. Therefore, the distance between the intrusion parts 83 and 85 of the first extensions and the intrusion parts 93 and 95 of the second extensions adjacent thereto may be constantly maintained.

Meanwhile, the serif 95c may be formed at a position where the connection part 97 meets the intrusion part 95 as described with reference to FIG. 2.

In the present exemplary embodiment, the intrusion part 85 and one line 95a of the intrusion part 95 may be disposed along the same line and the light emitting diode may have a symmetrical structure based on this line. In other words, the intrusion parts 93 may have the same symmetrical shape as each other and substantially the same length, and the intrusion parts 83 may also have the symmetrical shape to each other and substantially the same length. Therefore, the intrusion parts 93 may have substantially the same potential at corresponding positions and the intrusion parts 83 may have substantially the same potential at corresponding positions. Further, the length from the end of the intrusion part 93 to the second electrode pad 91 may be substantially the same as the length from the ends of two lines 95b of the intrusion part 95 to the second electrode pad 91. Further, the length from the ends of the intrusion part 83 to the first electrode pad 81 may be substantially the same as the length from the ends of the intrusion part 85 to the first electrode pad 81.

Unlike the exemplary embodiment shown in FIG. 2, in the present exemplary embodiment, the sub-intrusion parts are omitted and therefore, the reduction in light emitting area may be further mitigated.

Experimental Example

The stacked structure of the light emitting diode and the transparent electrode layer were formed under the same conditions, and the light emitting diodes shown in FIG. 1 (Comparative Example), FIG. 2 (Example 1), and FIG. 5 (Example 2) were manufactured, and then the light emitting area, the light output, and the forward voltage at 350 mA were measured, which are listed in the following Table 1. The size of the light emitting diode used in the experimental example was 1.1 mm×1.1 mm and the area of the active layer and the area of the second electrode pads and the second extensions were obtained by being calculated from a layout, the light emitting area was obtained by subtracting the area of the second electrode pads and the second extensions from the area of the active layer, and the relative value was shown based on the light emitting diode of FIG. 1.

TABLE 1

|  | Comparative Example | Example 1 | Example 2 |
|---|---|---|---|
| Area of active layer | 100 | 105.07 | 104.78 |
| Sum of areas of second electrode pads and second extensions | 100 | 138.66 | 117.68 |
| Light emitting area | 100 | 101.84 | 103.554 |
| Light output | 100 | 106.07 | 107.49 |
| Forward voltage (@350 mA) | 100 | 97.81 | 98.09 |

Referring to Table 1, in the case of Examples 1 and 2, the area of the active layer was larger by 4 to 5% and the light emitting area was relatively larger even when the areas of the second electrode pads and the second extensions were relatively increased, as compared to Comparative Example. Further, in the case of Examples 1 and 2, when the light output was improved by 6 to 7%, the forward voltage was reduced to about 2%, as compared to the Comparative Example.

According to the exemplary embodiments, it is possible to provide a light emitting diode that improves current spreading capability while mitigating the reduction in the light emitting area occurring due to the formation of the electrode extensions. It is also possible to provide a light emitting diode capable of reducing the forward voltage while improving the light output, as compared to the related art.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A light emitting diode, comprising:
a substrate comprising a first edge and a second edge opposite to each other;
a light emitting structure disposed on the substrate, the light emitting structure comprising a first semiconductor layer and a second semiconductor layer;
a plurality of first electrode pads arranged on an upper surface of the first semiconductor layer, the first electrode pads arranged in a vicinity of the first edge;
a plurality of second electrode pads arranged on the second semiconductor layer, the second electrode pads arranged in a vicinity of the second edge;
a plurality of first extensions, each first extension extending from a first electrode pad; and
a plurality of second extensions, each second extension extending from a second electrode pad,
wherein the first extensions comprise intrusion parts extending in a direction from the first edge to the second edge, the intrusion parts being spaced apart from each other and not is connecting with the second electrode pads,
wherein the second extensions comprise:
intrusion parts extending in a direction from the second edge to the first edge, and
a second extension connection part connecting adjacent second electrode pads to each other,
wherein the first extension intrusion parts each extend into a region between two of the second extension intrusion parts, and wherein at least one of the second extension intrusion parts extends from the second extension connection part to the vicinity of the first edge.

2. The light emitting diode of claim 1, further comprising a transparent electrode layer disposed between the second extensions and the second semiconductor layer, the transparent electrode layer covering at least a portion of the second semiconductor layer.

3. The light emitting diode of claim 1, wherein a length from an end of each first extension intrusion part to the first electrode pad to which each first extension intrusion part is respectively connected is the same, and
wherein a length from an end of each second extension intrusion part to the second electrode pad to which each second extension intrusion part is respectively connected is the same.

4. The light emitting diode of claim 1, wherein two intrusion parts disposed at outermost sides among the second extension intrusion parts extend to a distance from the first edge that is less than a distance from the center of each first electrode pad to the first edge.

5. The light emitting diode of claim 1, wherein the second extensions further comprise serifs extending to both sides of the at least one second extension intrusion part at a position where the second extension intrusion part contacts the second extension connection part.

6. The light emitting diode of claim 1, wherein the first extension intrusion parts directly extend from the first electrode pads to the vicinity of the second edge.

7. The light emitting diode of claim 1, wherein the first extensions further comprise a first extension connection part connecting adjacent first electrode pads to each other.

8. The light emitting diode of claim 7, wherein at least one of the first extension intrusion parts extends from the first extension connection part to the vicinity of the second edge.

9. The light emitting diode of claim 1, wherein the first extension intrusion parts and the second extension intrusion parts each comprise sub-intrusion parts arranged substantially parallel to the first edge and the second edge.

10. The light emitting diode of claim 1, wherein the second extension connection part comprises a curved shape.

11. The light emitting diode of claim 10, wherein one of the second extension intrusion parts extending from the second extension connection part to the vicinity of the first edge branches from one line into two lines, each of the two lines comprising a curved portion.

12. The light emitting diode of claim 11, wherein the first extensions further comprise a first extension connection part connecting the first electrode pads to each other, and
one of the first extension intrusion parts extends to a region between the two lines of the second extension intrusion part.

13. The light emitting diode of claim 11, wherein the first extensions comprise intrusion parts extending from the first electrode pads to the vicinity of the second edge, and
at least one of the first extension intrusion parts comprises an end portion bent along the curved portion of one of the two lines of the second extension intrusion part.

14. The light emitting diode of claim 13, wherein at least one of the second extension intrusion parts arranged at an outside of the first extension intrusion parts comprises a curved portion corresponding to the shape of the end portion of the at least one first extension intrusion part.

15. The light emitting diode of claim 11, wherein the second extensions further comprise serifs extending to both sides of the second extension intrusion part at a position where the second extension intrusion part contacts the second extension connection part.

16. The light emitting diode of claim 1, wherein the at least one of the second extension intrusion parts extending from the second extension connection part directly contacts the second extension connection part.

* * * * *